(12) United States Patent
Gaowei et al.

(10) Patent No.: US 12,033,846 B2
(45) Date of Patent: Jul. 9, 2024

(54) CO-DEPOSITION OF CESIUM TELLURIDE PHOTOCATHODE AND X-RAY FLUORESCENCE CONTROLLER CO-DEPOSITION OF CESIUM TELLURIDE PHOTOCATHODE

(71) Applicant: United States Department of Energy, Washington, DC (US)

(72) Inventors: Mengjia Gaowei, Stony Brook, NY (US); John Smedley, White Rock, NM (US); John Walsh, Upton, NY (US); Jiajie Cen, San Jose, CA (US); John Jay Sinsheimer, Centereach, NY (US)

(73) Assignee: U.S. Department of Energy, Washington, DC (US)

( * ) Notice: Subject to any disclaimer, the term of this patent is extended or adjusted under 35 U.S.C. 154(b) by 375 days.

(21) Appl. No.: 17/071,501

(22) Filed: Oct. 15, 2020

(65) Prior Publication Data
US 2021/0118640 A1   Apr. 22, 2021

Related U.S. Application Data

(60) Provisional application No. 62/915,138, filed on Oct. 15, 2019.

(51) Int. Cl.
*H01J 9/12* (2006.01)
*C01B 19/00* (2006.01)
(Continued)

(52) U.S. Cl.
CPC ............. *H01J 9/12* (2013.01); *C01B 19/007* (2013.01); *C23C 14/06* (2013.01); *C23C 14/24* (2013.01); *C23C 14/52* (2013.01)

(58) Field of Classification Search
CPC .......... H01J 9/12; C01B 19/007; C23C 14/06; C23C 14/24; C23C 14/52; C23C 14/0623; C23C 14/243; C23C 14/246; C23C 14/548
See application file for complete search history.

(56) References Cited

U.S. PATENT DOCUMENTS 3,845,496 A * 10/1974 Martinelli ................. H01J 1/34
313/542
8,729,799 B1 * 5/2014 Terdik ..................... H01J 40/06
313/542
(Continued)

FOREIGN PATENT DOCUMENTS

WO    WO-9722153 A1 *  6/1997 ....... H01L 21/02395

OTHER PUBLICATIONS

Keenan et al, "In-situ stoichiometry determination using x-ray fluorescence generated by reflection high-energy-electron-diffraction", J. Appl. Phys. 109, 114305 (2011); https://doi.org/10.1063/1.3592219; Published Online: Jun. 3, 2011 (Year: 2011).*

(Continued)

*Primary Examiner* — Michael G Miller
(74) *Attorney, Agent, or Firm* — Timothy L. Harney; Daniel Park; Brian J. Lally

(57) ABSTRACT

One or more embodiments relates to a system and method for growing ultrasmooth and high quantum efficiency photocathodes. The method includes exposing a substrate of Si wafer to an alkali source; controlling co-evaporating growth and co-deposition forming a growth including Te; and monitoring a stoichiometry of the growth, forming the photocathodes.

8 Claims, 15 Drawing Sheets

(51) Int. Cl.
    C23C 14/06    (2006.01)
    C23C 14/24    (2006.01)
    C23C 14/52    (2006.01)

(56) References Cited

U.S. PATENT DOCUMENTS

2004/0069960 A1*  4/2004  Maldonado ............ B82Y 10/00
                                                    250/492.24
2016/0365217 A1* 12/2016  Smedley ................... H01J 9/42
2018/0191265 A1*  7/2018  Bennett ................ H03K 17/941

OTHER PUBLICATIONS

Gaowei ("Synthesis and x-ray characterization of Cesium Telluride photocathodes", Gaowei et al, presentation for Photocathode Physics for Photoinjectors (P3) 2018, available online Oct. 13, 2018, 16 pages) (Year: 2018).*
Google Search results validating Gaowei availability date (Year: 2023).*
Gaowei et al, "Codeposition of ultrasmooth and high quantum efficiency cesium telluride photocathodes", Physical Review Accelerators and Beams 22, 073401 (2019), 6 pages. (Year: 2019).*

* cited by examiner

CO-DEPOSITION OF CESIUM TELLURIDE PHOTOCATHODE AND X-RAY FLUORESCENCE CONTROLLER CO-DEPOSITION OF CESIUM TELLURIDE PHOTOCATHODE

CROSS-REFERENCE TO RELATED APPLICATIONS

This application claims the benefit of and priority to U.S. Provisional Application 62/915,138 filed Oct. 15, 2019 titled Co-Deposition of Cesium Telluride Photocathode and X-ray Fluorescence Controlled Co-Deposition of Cesium Telluride Photocathode, which is incorporated herein by reference in its entirety.

STATEMENT OF GOVERNMENT SUPPORT

The United States Government has rights in this invention pursuant to contract number DE-SC0012704 awarded by the U.S. Department of Energy.

FIELD OF THE INVENTION

Embodiments relate to photocathodes. More specifically embodiments relate to one or more embodiments relating to a method of growing ultrasmooth and high quantum efficiency CsTe photocathodes.

BACKGROUND

Cesium telluride (CsTe) may be used as the electron source material for high bunch charge, high repetition rate superconducting radio frequency electron injectors, which is essential for the state-of-art energy recovery linacs and high-power free electron lasers (FELs). CsTe is further desirable as a cathode material due to its balanced properties between the high quantum efficiency (over 10% at its working wavelength), long lifetime (over a span of several months) and its robustness to chemical contamination and high gradient environment compared to other cathode materials such as for example GaAs:Cs and multialkali antimonide photocathodes.

Cesium telluride coatings have been developed to protect GaAs photocathode as spin-polarized electron sources. There is a growth recipe for cesium telluride and the conditions and performance may vary. This variability may indicate that there is a complexity of mechanisms in the chemical reaction of cesium and tellurium. Efforts towards characterizing this mechanism using x-ray photoemission spectroscopy and Auger electron spectroscopy, may lead to a conclusion that the final product can be a random combination of various Cs—Te compounds, resulting in the differed performance in quantum efficiency and cathode lifetime. However, compared to the well-developed growth procedure and frequently reported performance study, there is still a need for structural and chemical characterization of this material.

Further previous attempts on the co-deposition of cesium telluride were rarely reported and is most likely from SAES getter sources. The low output of SAES getter sources make the co-deposition process hard to control and the resultant photocathode low in quality.

A need exists in the art for a method of growing ultrasmooth and high quantum efficiency CsTe photocathodes.

SUMMARY

One object of at least one embodiment is to grow ultrasmooth and high quantum efficiency photocathodes, CsTe photocathodes for example.

One or more embodiments relates to a method of growing ultrasmooth and high quantum efficiency photocathodes. The method includes exposing a substrate of Si wafer to an alkali source; controlling co-evaporating growth and co-deposition forming a growth including Te; and monitoring a stoichiometry of the growth, forming the photocathodes.

Embodiments include using an effusion source that includes one or more effusion cells. In one or more embodiments, the substrate is exposed to a high vapor pressure of an alkali metal group using the alkali source selected from the alkali metal group.

In one or more embodiments the alkali source is selected from an alkali metal group comprising Cs, K, Li, and the like. More specific embodiments include the alkali source is Cs and the growth comprises CsTe. Embodiments include using a Te source to control the co-evaporating growth and co-deposition. The Te source may be turned on slowly to control the co-evaporating growth and co-deposition.

Additional embodiments may include using in situ real time x-ray fluorescence to monitor the stoichiometry of the growth including Te growth, such that the stoichiometry of the growth including Te growth is about 2:1.

Still other embodiments relate to a method of growing ultrasmooth and high quantum efficiency CsTe photocathodes. The method includes exposing a substrate to a high vapor pressure of Cs using an alkali source; controlling co-evaporating growth and co-deposition using a Te source, forming a CsTe growth; and monitoring a stoichiometry of the CsTe growth using in situ real time x-ray fluorescence.

The following documents are incorporated herein by reference in their entireties:
1. S. H. Kong, D. C. Nguyen, R. L. Sheffield, and B. A. Sherwood, Fabrication and characterization of cesium telluride photocathodes-A promising electron source for the Los-Alamos advanced FEL, Nucl. Instrum. Methods Phys. Res., Sect. A 358, 276 (1995).
2. D. Filippetto, H. Qian, and F. Sannibale, Cesium telluride cathodes for the next generation of high-average current high-brightness photoinjectors, Appl. Phys. Lett. 107, 042104 (2015).
3. R. L. Ives, G. Collins, D. Marsden, T. Bui, and E. Montgomery, Long-life photocathodes with high quantum efficiency, in *Proceedings of the 18th International Vacuum Electronics Conference* (IVEC, London, 2017).
4. P. Musumeci, J. G. Navarro, J. B. Rosenzweig, L. Cultrera, I. Bazarov, J. Maxson, S. Karkare, and H. Padmore, Advances in bright electron sources, Nucl. Instrum. Methods Phys. Res., Sect. A 907, 209 (2018).
5. R. Xiang, L. Lin, B. Zhang, X. Lu, S. Quan, L. Wang, and K. Zhao, Research and fabrication of the photocathode used in DC-SC photocathode rf electron gun, At. Energ. Sci. Technol. 38, 185 (2004).
6. E. E. Wisniewski, D. Velazquez, Z. Yusof, L. Spentzouris, J. Terry, T. J. Sarkar, and K. Harkay, Kelvin probe studies of cesium telluride photocathode for AWA photoinjector, Nucl. Instrum. Methods Phys. Res., Sect. A 711, 60 (2013).
7. E. Prat, S. Bettoni, H. H. Braun, R. Ganter, and T. Schietinger, Measurements of copper and cesium telluride cathodes in a radio-frequency photoinjector, Phys. Rev. ST Accel. Beams 18, 043401 (2015).

8. F. Sannibale, M. Zolotorev, R. Wells et al., Status, plans and recent results from the APEX project at LBNL, in *Proceedings of the 37th International Free Electron Laser Conference* (JACoW, Daejeon, Korea, 2015), pp. 81-84.
9. R. Corsini, S. Curt, R. Jones et al., First Experiments at the CLEAR User Facility, in *Proceedings of the 9th International Particle Accelerator Conference* (JACoW, Vancouver, Canada, 2018), pp. 4066-4069.
10. S. Schreiber, S. Lederer, P. Michelato, L. Monaco, and D. Sertore, Update on the lifetime of Cs2Te photocathodes operated at FLASH, in *Proceedings of the 38th International Free Electron Laser Conference* (JACoW, Geneva, Switzerland, 2018), pp. 407-410.
11. R. A. Loch, Master thesis, University of Twente, 2005.
12. J. K. Bae, L. Cultrera, P. DiGiacomo, and I. Bazarov, Rugged spin-polarized electron sources based on negative electron affinity GaAs photocathode with robust $Cs_2Te$ coating, Appl. Phys. Lett. 112, 154101 (2018).
13. A. Ruth, K. Nemeth, K. C. Harkay, J. Z. Terdik, L. Spentzouris, and J. Terry, Searching for low-workfunction phases in the Cs—Te system: The case of $Cs_2Te_5$, J. Appl. Phys. 113, 183703 (2013).
14. A. di Bona, F. Sabary, S. Valeri, P. Michelato, D. Sertore, and G. Suberlucq, Auger and x-ray photoemission spectroscopy study on $Cs_2Te$ photocathodes, J. Appl. Phys. 80, 3024 (1996).
15. F. Sabary, S. Valeri, P. Michelato, C. Pagani, and D. Sertore, Formation of the $Cs_2Te$ photocathode: Auger and photoemission spectroscopy study, in *Proceedings of the 5th European Particle Accelerator Conference* (JACoW, Sitges, Spain, 1996).
16. V. A. Sole, E. Papillon, M. Cotte, P. Walter, and J. Susini, A multiplatform code for the analysis of energy-dispersive x-ray fluorescence spectra, Spectrochim. Acta B Atom. Spectros. 62, 63 (2007).
17. A. Jain et al., Commentary: The materials project: A materials genome approach to accelerating materials innovation, APL Mater. 1, 011002 (2013).
18. S. Schubert, M. Ruiz-Oses, I. Ben-Zvi et al., Bi-alkali antimonide photocathodes for high brightness accelerators, APL Mater. 1, 032119 (2013).
19. C. Y. Su, W. E. Spicer, and I. Lindau, Photoelectron spectroscopic determination of the structure of (Cs,O) activated gas (110) surfaces, J. Appl. Phys. 54, 1413 (1983).
20. L. G. Parratt, Surface studies of solids by total reflection of x-rays, Phys. Rev. 95, 359 (1954).
21. J. Q. Xie et al., Synchrotron x-ray study of a low roughness and high efficiency $K_2CsSb$ photocathode during film growth, J. Phys. D 50, 205303 (2017).
22. Z. H. Ding et al., Temperature-dependent quantum efficiency degradation of K—Cs—Sb bialkali antimonide photocathodes grown by a triple-element codeposition method, Phys. Rev. Accel. Beams 20, 113401 (2017).
23. J. Feng, S. Karkare, J. Nasiatka, S. Schubert, J. Smedley, and H. Padmore, Near atomically smooth alkali antimonide photocathode thin films, J. Appl. Phys. 121, 044904 (2017).
24. T. Vecchione, I. Ben-Zvi, D. H. Dowell, J. Feng, T. Rao, J. Smedley, W. Wan, and H. A. Padmore, A low emittance and high efficiency visible light photocathode for high brightness accelerator-based x-ray light sources, Appl. Phys. Lett. 99, 034103 (2011).

BRIEF DESCRIPTION OF THE DRAWINGS

The invention together with the above and other objects and advantages will be best understood from the following detailed description of the preferred embodiment of the invention shown in the accompanying drawings, wherein:

FIG. 2A illustrates the plot of Cs nominal thickness (nm) by QE and FIG. 2B illustrates the plot of Binding Energy (eV) by Intensity);

FIGS. 4A-4B depict a Cs—Te cathode growth with effusion cell illustrated in FIG. 4A while FIG. 4B illustrates a Te evaporator and Cs effusion cells, In situ, in operando XRR, XRF, XRD & Quantum efficiency (QE) measurement;

FIG. 6A illustrates the thickness increases of each deposition step recorded by the QCM; FIG. 6B illustrates real time out-of-plane x-ray diffraction pattern of the full growth with the beginning period of Cs step marked by the red dotted lines; and FIG. 6C illustrates an enlarged portion of the red dotted portion of FIG. 6B showing detailed phase change during growth;

FIG. 7A illustrates the thickness evolution from the QCM and FIG. 7B illustrates the real time XRD pattern recorded over the entire growth process;

FIG. 8A illustrates the sequential deposited and where FIG. 8B illustrates co-deposited CsTe photocathodes;

FIG. 10A depicts sequential CsTe photocathodes and FIG. 10B depicts co-deposited CsTe photocathodes.

DETAILED DESCRIPTION

The foregoing summary, as well as the following detailed description of certain embodiments of the present invention, will be better understood when read in conjunction with the appended drawings.

The following detailed description should be read with reference to the drawings in which similar elements in different drawings are numbered the same. The drawings, which are not necessarily to scale, depict illustrative embodiments and are not intended to limit the scope of the invention.

One or more embodiments relates to a method and system for growing ultrasmooth and high quantum efficiency photocathodes. The method includes exposing a substrate of Si wafer to an alkali source; controlling co-evaporating growth and co-deposition forming a growth including Te; and monitoring a stoichiometry of the growth, forming the photocathodes. In one or more embodiments the alkali source is selected from an alkali metal group comprising Cesium (Cs), Potassium (K), Lithium (Li) and the like. More specific embodiments include the alkali source is Cs and the growth comprises CsTe.

One or more embodiments disclose a sequential growth method and co-deposition for preparing a cesium telluride (CsTe) photocathode material. Using the co-deposition method, it is possible to grow a CsTe cathode with ultrasmooth surface (roughness ~2 nm), high quantum efficiency (19% at 266 nm) and highly crystallized structure. Real time in situ x-ray techniques including x-ray fluorescence spectroscopy (XRF), x-ray diffraction (XRD) and x-ray reflectivity (XRR) were used to characterize growth processes and provide detailed postanalysis.

Figure 1:
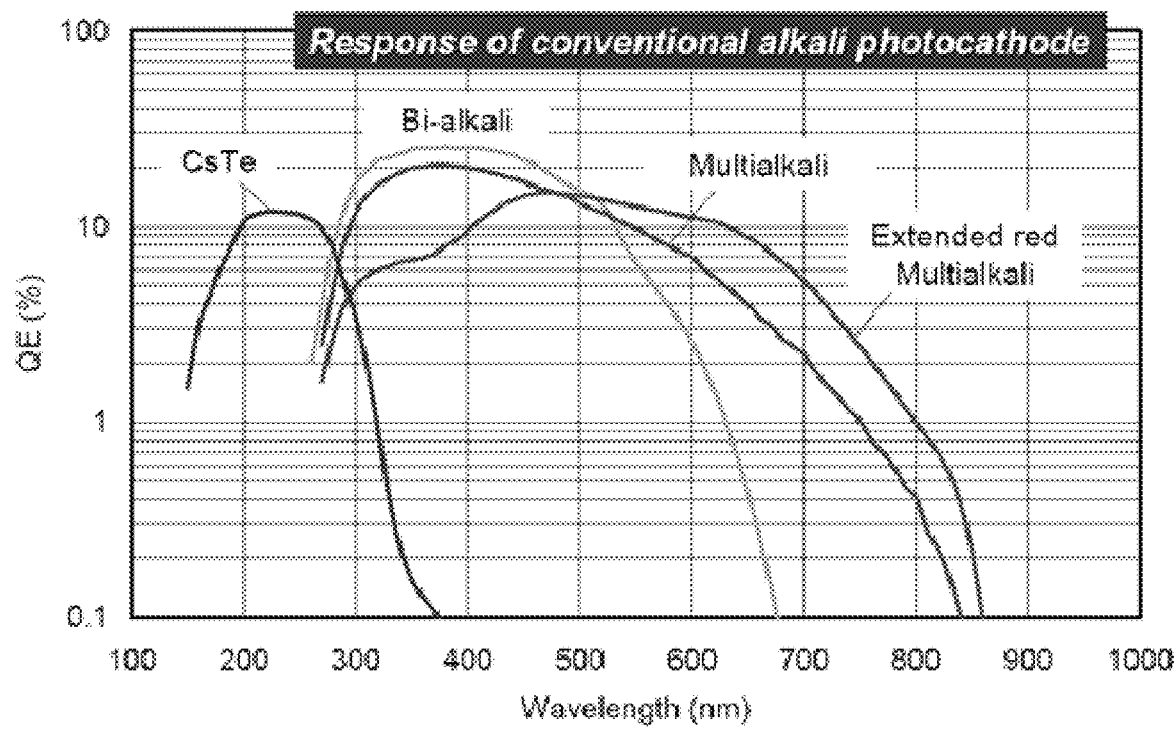
FIG. 1 depicts a graph illustrating the response of conventional alkali photocathode for CsTe, Bi-alkali, Multialkali, and Extended red Multialkali on plot of Wavelength (nm) by QE (%)

FIG. 1 depicts a graph illustrating the response of conventional alkali photocathode for CsTe, Bi-alkali, Multialkali, and Extended red Multialkali on plot of Wavelength (nm) by QE (%).

Figure 2A:
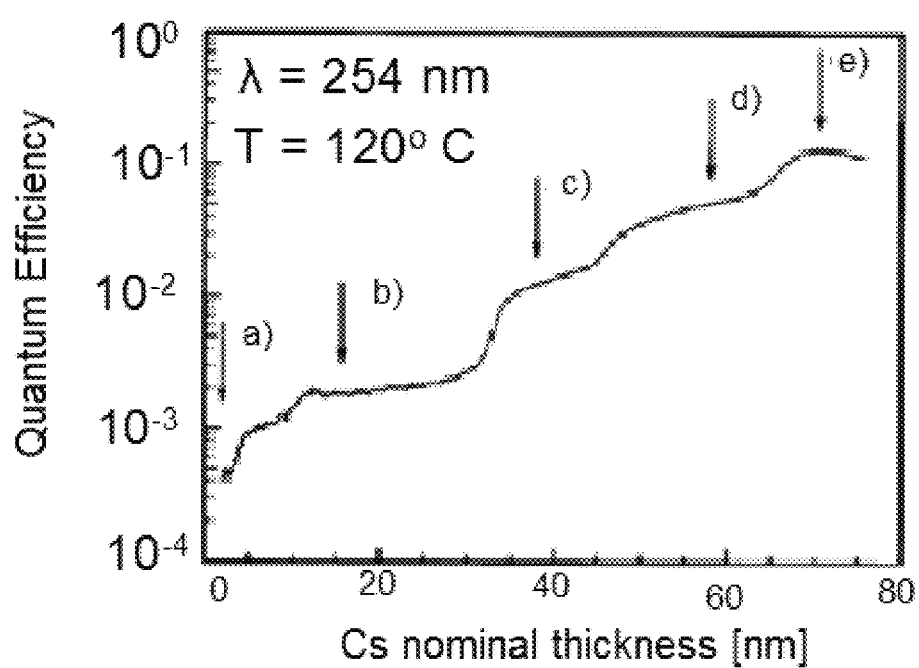
FIGS. 2A-2B depict graphs where
Figure 2B:
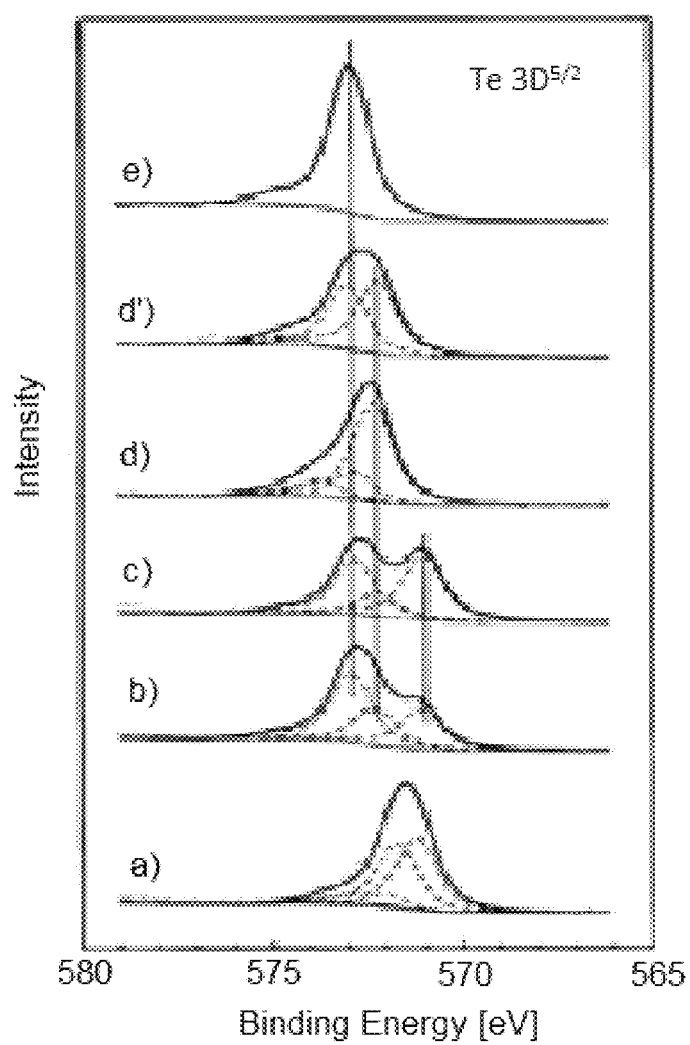

FIGS. 2A-2B depict graphs where FIG. 2A illustrates the plot of Cs nominal thickness (nm) by QE and FIG. 2B illustrates the plot of Binding Energy (eV) by Intensity). Table 1 depicts various Materials ID, Formulas and Spacegroups

TABLE 1

| Material ID | Formula | Spacegroup |
| --- | --- | --- |
| mp-8361 | $C_5Te$ | Pbam |
| mp-505464 | $C_{s2}Te_{13}$ | Pbcm |
| mp-573763 | $C_{s2}Te$ | Pnma |
| mp-505634 | $C_{s2}Te_3$ | $Cmc2_1$ |
| mp-620471 | $C_{s3}Te_{22}$ | P1 |

Figure 3:
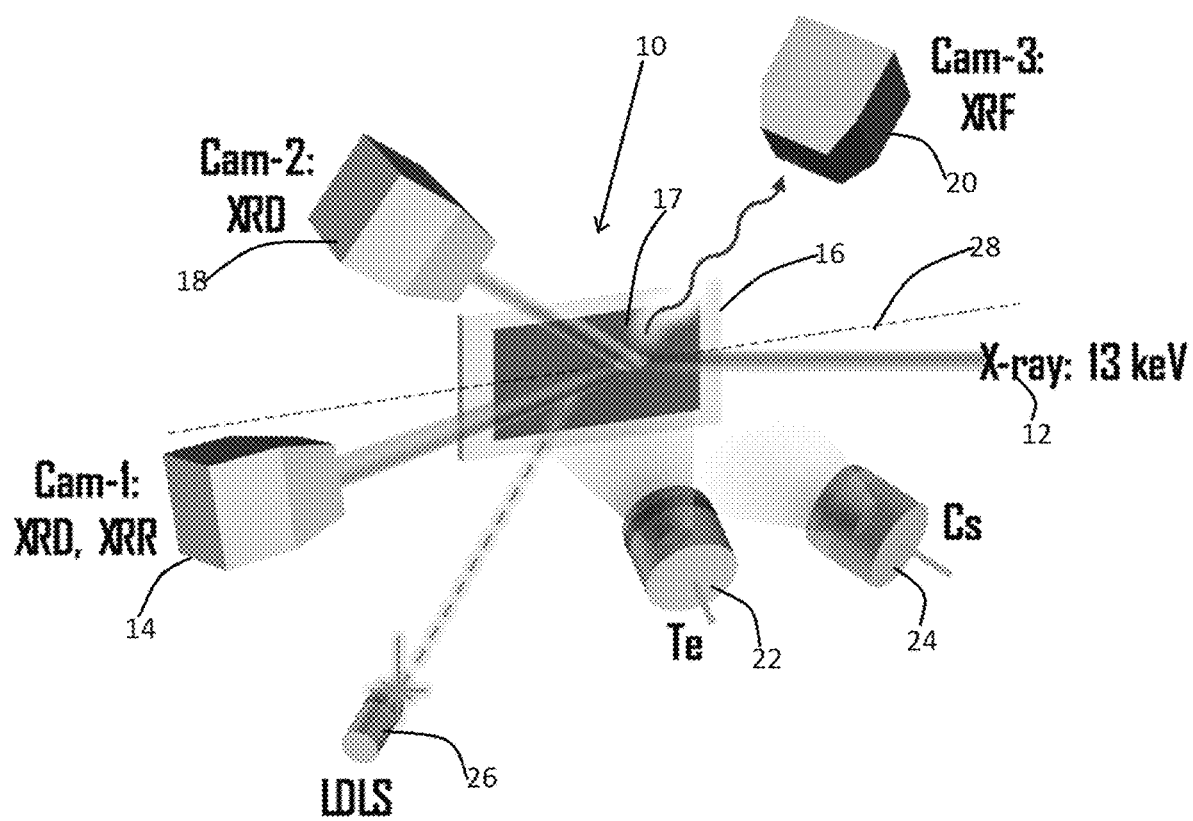
FIG. 3 depicts a schematic diagram of in situ and real time x-ray apparatus.

One embodiment of a beam line setup 10 is illustrated in FIG. 3. The setup 10 includes an x-ray beam 12 where the photon energy of the incident x-ray beam 12 is 13 keV (1, =0.95 A). Set up 10 measures XRR and/or XRD data using a four-axis diffractometer with two Pilatus 100 K x-ray cameras 14 and 18. In at least one embodiment, the difference between the XRR and the XRD measurements is the angle range. Cam-1 14 is mounted downstream from the substrate 16, 100 cm downstream for example, and Cam-2 18 is mounted approximate Cam-1 14. In one embodiment, Cam-2 18 is mounted about 30° from Cam-1 14 and 30 cm away from the substrate sample 16. XRR measurements are performed by scanning the 2θ angle from 0° to 6° and XRD is measured with a 2θ range from 5° to 30°. The XRF spectra is measured by a CAM-3 20 which in one embodiment is a vortex multicathode x-ray detector. In one embodiment, CAM-3 20 is mounted 45° with respect to the surface 17 of the sample or substrate 16, normal to and approximately 25 cm away from the sample or substrate 16.

As illustrated in FIG. 3, the setup 10 includes a Te evaporator 22, an alkali source, a cesium effusion cell 24 for example, and a laser driven light source (LDLS) 26. In one embodiment, the LDLS 26 is an optical system consisting of a laser driven light source and a Cornerstone monochromator. In the illustrated embodiment, the Te evaporator 22 is mounted at the same height as the substrate 16 and when in position, the distance between the Te evaporator 22 and the substrate 16 is ~6 cm. The cesium effusion cell 24 output is mounted approximately 45° below the sample rotation plane 28 of the substrate or sample 16 and ~10 cm from the substrate 16.

In at least one embodiment, Si (100) substrates 16 are formed by freshly etching using hydrofluoric acid for example to remove the native oxides. Substrates 16 are loaded into the growth chamber and annealed at about 550° C. for about 1 hr. The evaporation rate is controlled by adjusting the current of evaporators and was measured with a quartz crystal microbalance (QCM) placed alongside the sample. During deposition, the substrate temperature is set to about 120° C., and the growth rate is around 0.1-0.2 Å/s. After growth, the spectral response of each sample from 200 to 400 nm is measured using an optical system consisting of a laser driven light source and a Cornerstone monochromator. The photocurrent is collected using a Keithley 65178 electrometer.

Figure 4A:
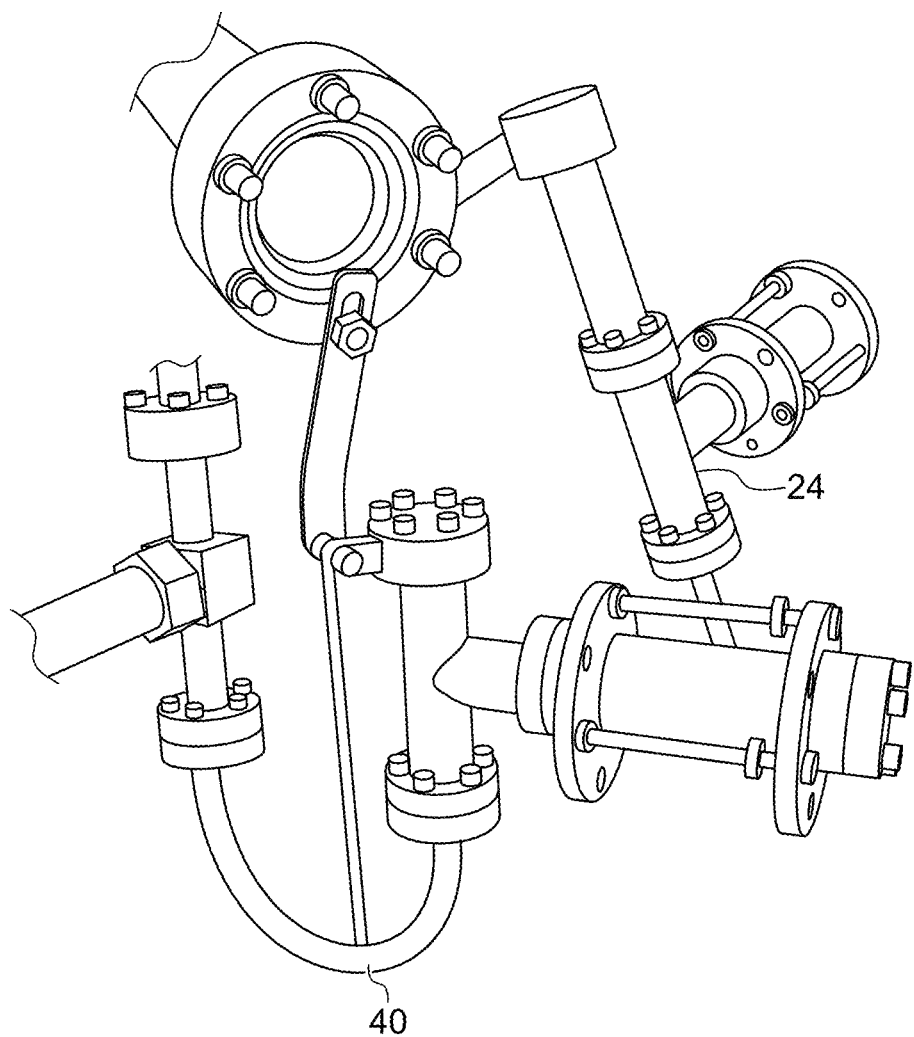
Figure 4B:

In at least one embodiment illustrated in FIGS. 4A-4B, cesium telluride photocathodes are synthesized in an ultrahigh vacuum chamber with tellurium evaporator 22 (not shown in FIG. 4A) and Cs effusion cell 24 attached. In this exemplary embodiment, a Cs breakseal ampoule, one gram for example, was loaded into the vacuum housing having a J-shaped stainless-steel bend 40 attached to the bottom of the housing. The Cs effusion cell 24 is separated with the main deposition chamber by a UHV needle valve. The vacuum housing is preheated, and the glass ampule broken by crushing from the side. The melted Cs is then collected by the J-shaped stainless-steel tube (J-bend) 40 underneath, which would serve as the Cs reservoir in this embodiment. During deposition, the J-bend 40 along with the whole effusion cell vacuum housing is heated and Cs vapor is guided through a stainless-steel pathway heated by circulating hot N2. A shutter is installed in the vacuum chamber at the output of the guiding tube to terminate the Cs vapor flow at the end of the growth when the sources are cooling. The effusion cell output is mounted approximately 45° below the sample rotation plane and ~10 cm away from the substrate. The Te evaporator is mounted at the same height with the substrate and when in position, the distance between the Te source and the substrate is ~6 cm. Te was evaporated by heating an alumina crucible loaded with crushed Te metal chunks. The position of the effusion cell and the Te evaporator are illustrated in FIG. 3.

Figure 5:
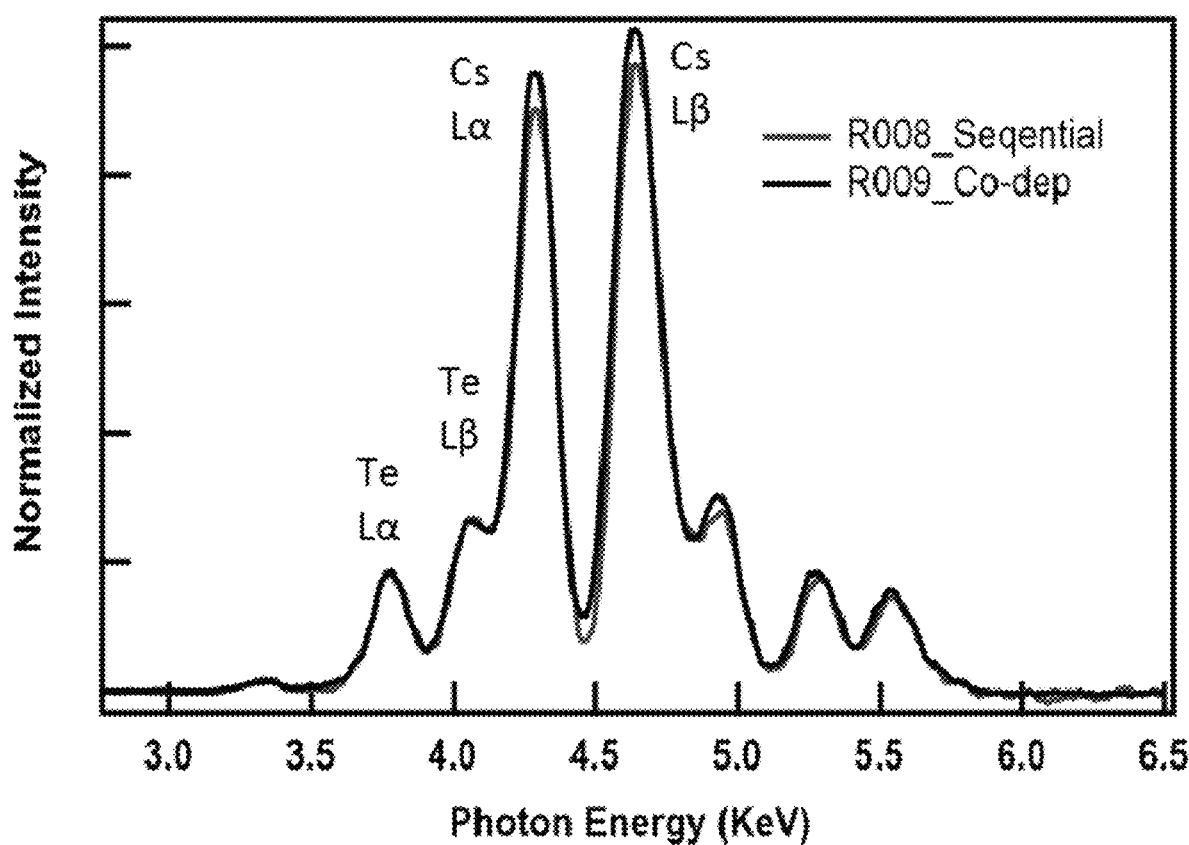
FIG. 5 depicts a graph illustrating XRF spectra of sequentially grown (red curve) and co-deposited (dark curve) CsTe photocathodes, where the curves are normalized with Te peaks and the co-deposited cathode incorporates more Cs than the sequential one.

A graph illustrating X-ray fluorescence spectrum of the 2 CsTe photocathodes grown by sequential and co-dep (co-deposition) methods respectively are shown in FIG. 5. Both spectra are normalized with Te L peaks. The difference in the Cs peak height indicates that the co-dep sample (dark curve) incorporates more Cs during growth than the sequential sample. The XRF spectra were analyzed using the software package PYMCA. The calculated stoichiometry from fitting the spectra is listed in Table 2. The fitted stoichiometry for both sequential and co-dep sample is found to be much lower than the believed $Cs_2Te$.

TABLE 2

| Sample | Te | Cs (±0.05) |
| --- | --- | --- |
| Sequential | 1.00' | 1.15 |
| Codeposition | 1.0 | 1.30 |

Figures 6A, 6B:
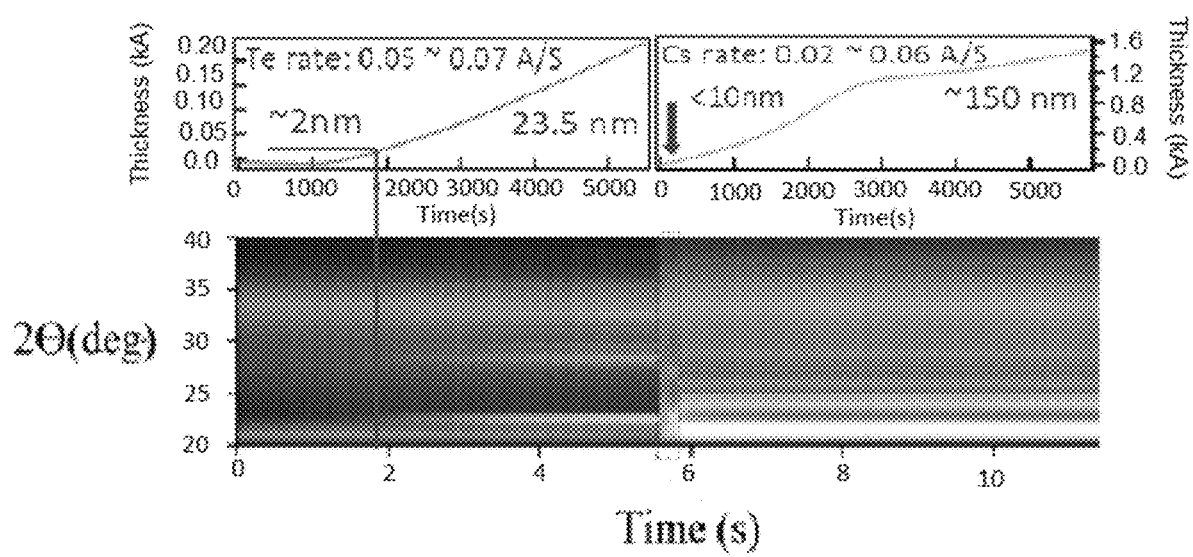
FIGS. 6A-6C depict graphs illustrating structural evolution of a sequentially grown CsTe photocathode with plots where
Figure 6C:
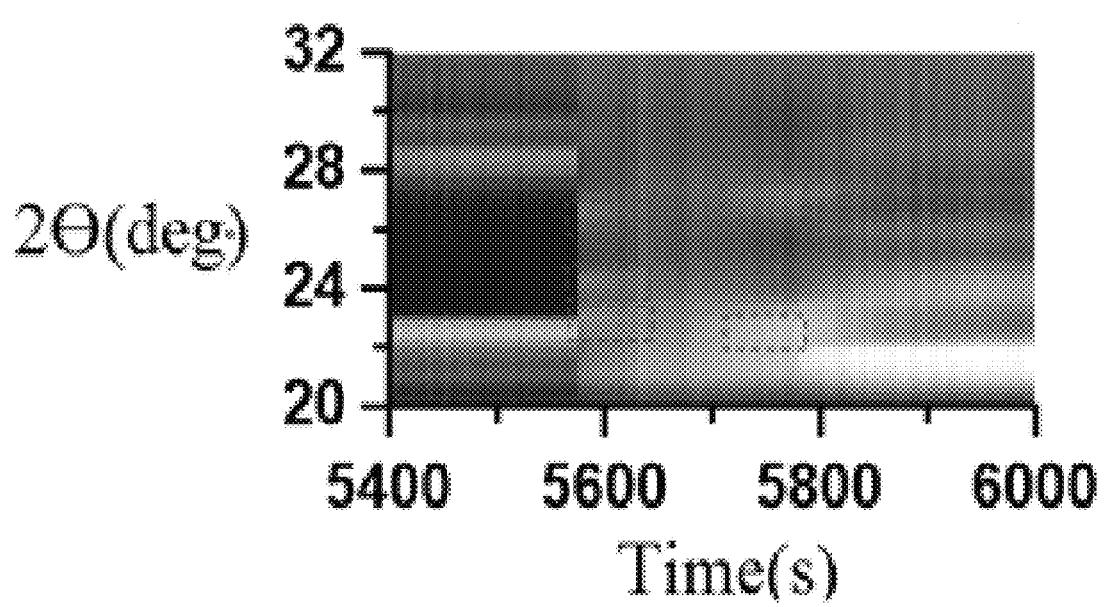
Figures 7A, 7B:
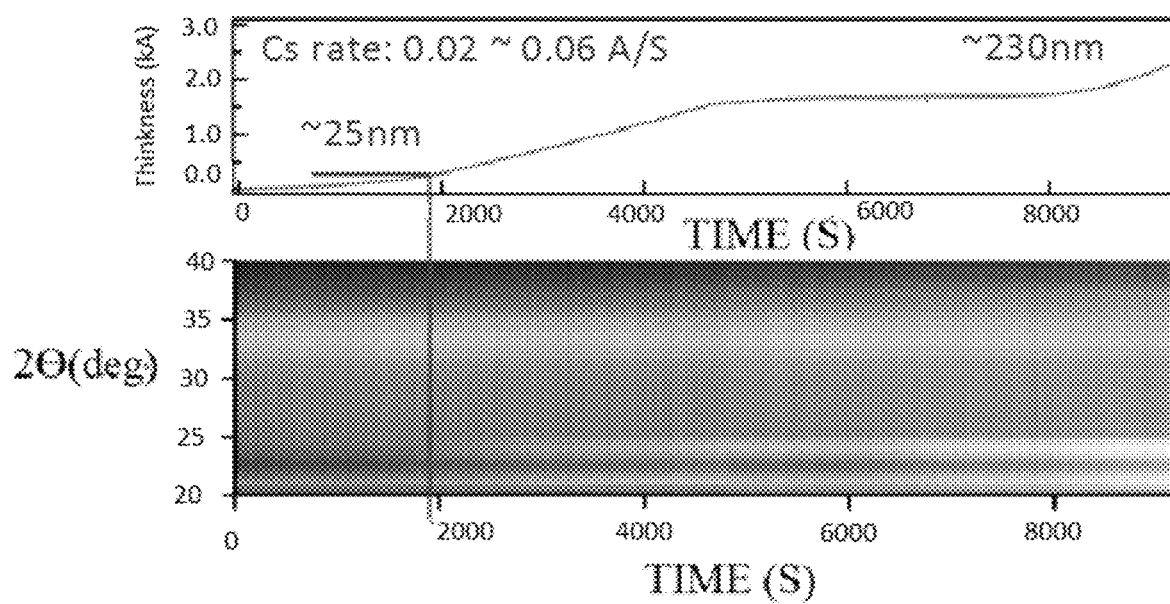
FIGS. 7A-7B depicts graphs illustrating the structural evolution of a co-deposited CsTe photocathode with plots where

The evolution of the diffraction pattern from both the sequential growth and the co-deposition is illustrated in FIGS. 6A-6C and 7A-7B. FIGS. 6A-6C depict graphs illustrating structural evolution of a sequentially grown CsTe photocathode with plots where FIG. 6A illustrates the thickness increases of each deposition step recorded by the QCM; FIG. 6B illustrates real time out-of-plane x-ray diffraction pattern of the full growth with the beginning period of Cs step marked by the red dotted lines; and FIG. 6C illustrates an enlarged portion of the red dotted portion of FIG. 6B showing detailed phase change during growth. FIGS. 7A-7B depict graphs illustrating the structural evolution of a co-deposited CsTe photocathode with plots where FIG. 7A illustrates the thickness evolution from the QCM and FIG. 7B illustrates the real time XRD pattern recorded over the entire growth process.

In FIGS. 6A-6C, the diffraction peaks of Te appeared around a deposited thickness of 2 nm. The intensity of the diffraction peaks continued to increase while maintaining the same phase throughout the growth. The accumulated thickness of Te deposition on the QCM is about 23.5 nm, with a rate controlled at 0.05-0.07 Å/s. Once the Cs deposition starts, the Te lines quickly disappear. A chaotic period of growth can be observed in the first 10 nm of Cs deposition, as illustrated in FIG. 6C. In this period, at least two crystal phases appeared and disappeared, marked with dotted lines in FIG. 6C and then a stable set of diffraction peaks appeared and became more and more intense as Cs deposition continues. In this study, the QE is not monitored during growth due to the x-ray induced current that overwhelms the current produced from the UV light. Instead, the real time x-ray fluorescence signal is monitored and the growth is stopped when we see the Cs peak intensities reach a maximum. At the end of the Cs deposition, 150 nm of Cs on the QCM was accumulated. The amount of Cs matched the reported Cs thickness from the sequential growth recipe. The fine 2θ scan after each layer is shown in FIG. 8A, where the dark line is the diffraction peaks for the Te layer and the red curve is the final CsTe layer.

Figure 8A:
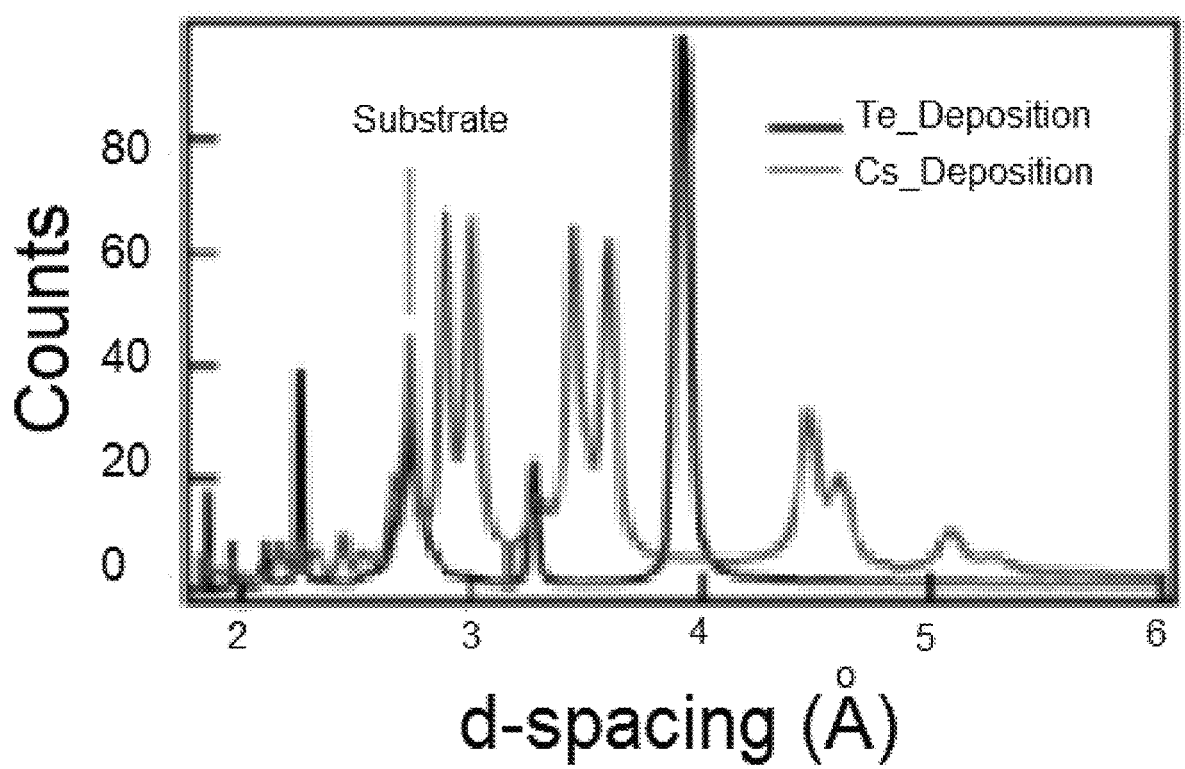
FIGS. 8A-8B depicts graphs illustrating the XRD spectrum after growth where
Figure 8B:
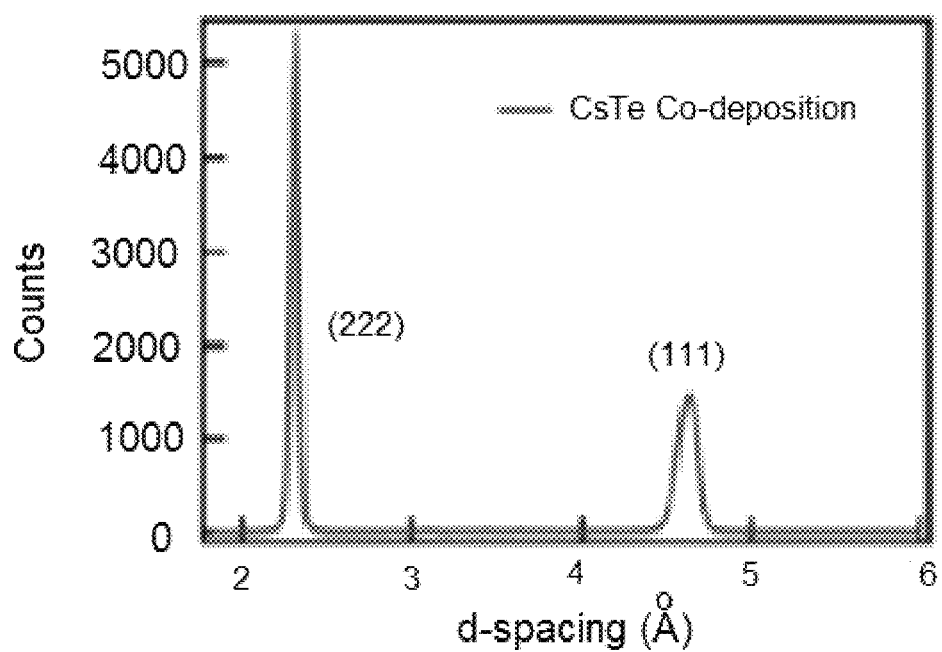

FIGS. 8A-8B depict graphs illustrating the XRD spectrum after growth where FIG. 8A illustrates the sequential deposited and where FIG. 8B illustrates co-deposited CsTe photocathodes. From FIG. 8A it may be seen that after the Cs deposition, the Te peaks are gone (almost all), indicating a full conversion of Te material. The weak intensity of the 2θ scan indicated that the films were not well crystalized. In the final film of the sequentially grown CsTe photocathodes two phases are identified, namely $Cs_2Te$ [(203) at d=3.005 Å, (103) at d=3.60 Å and (111) at d=4.60 Å] and $Cs_2Te_3$ [(132) at d=2.85 Å, (131) at d=3.44 Å and (021) at d=5.08 Å] [17]. The combination of the two materials could have resulted in the ratio obtained from the fitting result of the x-ray fluorescence.

The structural evolution of the co-dep sample is straightforward. In FIG. 7B, fewer diffraction can be seen compared with the sequentially grown CsTe layer. There was one stable phase throughout the growth. The post growth 2θ scan is shown in FIG. 8B. Compared to the sequentially grown layer, the intensities of the diffraction peaks are 2 orders of magnitude higher, indicating a strong crystallinity of this cathode. The two diffraction peaks are identified as the 222 (d=2.315 Å) and 111 (d=4.615 Å) phase of $Cs_2Te$. The diffraction spectrum of this sample is dominated by the $Cs_2Te$ phase, and no other diffraction peaks were observed. However, the x-ray fluorescence indicates that the film might still have phases that contain a lower Cs to Te ratio. Given that in the sequentially grown film there exist phases that are not well crystalized, it is plausible to believe that there might be other CsTe phases that cannot be detected by diffraction. It was also observed in the image on both cameras (data not shown) that the diffraction patterns from the sequentially grown layer were continuous lines, while those from the co-dep sample became bright dots, indicating the formation of a strongly textured film. The favorable orientation in this case is (222) for the co-dep sample.

Figure 9:
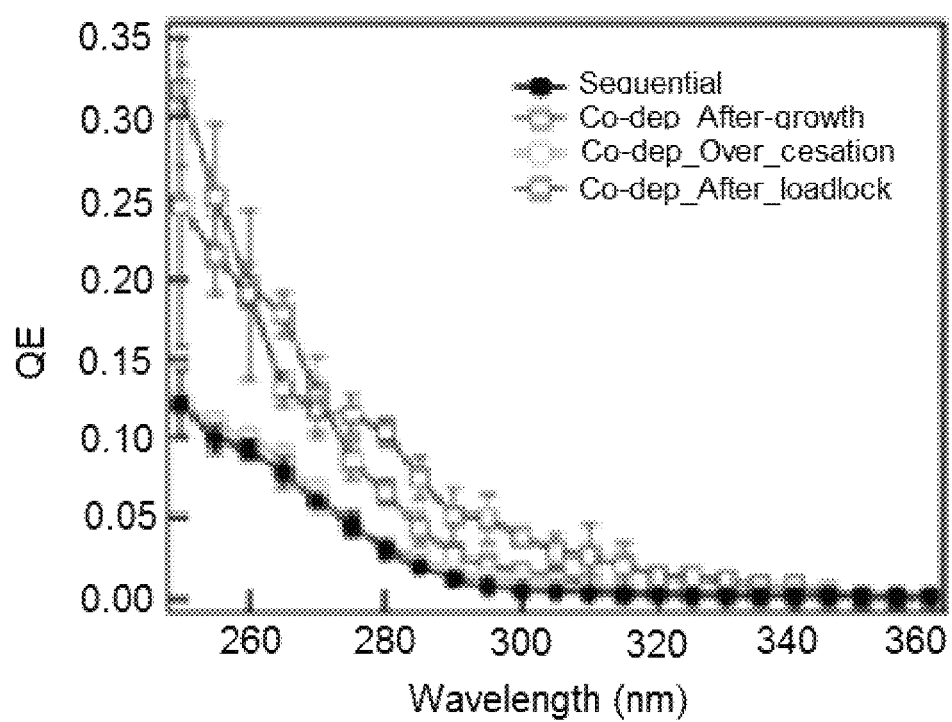
FIG. 9 depicts a graph illustrating the comparison of quantum efficiencies of the sequentially grown and co-deposited CsTe cathodes.

FIG. 9 depicts a graph illustrating the comparison of quantum efficiencies of the sequentially grown (solid circles) and co-deposited CsTe cathodes (hollow squares), where the comparison of the spectral response is shown in FIG. 9. After depositing excess Cs, the QE of the co-dep sample dropped dramatically (yellow curve), almost similar to the sequentially grown cathode, which might suggest that sequential cathode has excess Cs at the cathode surface. After exposing the cathode to an unbaked section of the chamber with a 10-8 torr vacuum, the QE of the co-dep sample came back to relatively the same QE as right after the growth, with a slightly better performance in the lower energy range around 300 nm (blue curve). In the measured range of 250 to 350 nm it can be seen that the co-dep cathode performs significantly better than the sequential cathode. At the wavelength of 266 nm, an operation wavelength in many facilities, the co-dep CsTe photocathode reached a QE of 19%, while the sequentially grown cathode is 8.5%, which is similar to previously reported QE.

The change in the behavior of the cathode may be explained by two mechanisms: the removal of the excess Cs and the formation of Cs—O dipole on the cathode surface which lowers the electron affinity, similar to the activation mechanism of GaAs:Cs photocathode. Post-x-ray fluorescence of the co-dep cathode after each treatment did not show an observable difference in the Cs composition (data not shown), indicating the mere surface modification of the treatment.

TABLE 3

|  | Thickness Å | Roughness Å |
| --- | --- | --- |
| After load lock | 968 ± 2.9 (Total $C_sTe$) | 19.1 ± 0.2 |
| After growth | 1026.1 ± 1.6 (Total $C_sTe$) | 19.10 ± 0.07 |
| Intermediate layer | 245.5 ± 1.7 | 9.55 ± 0.14 |
| Si Substrate | . . . | 3.75 ± 0.02 |

Figure 10A:
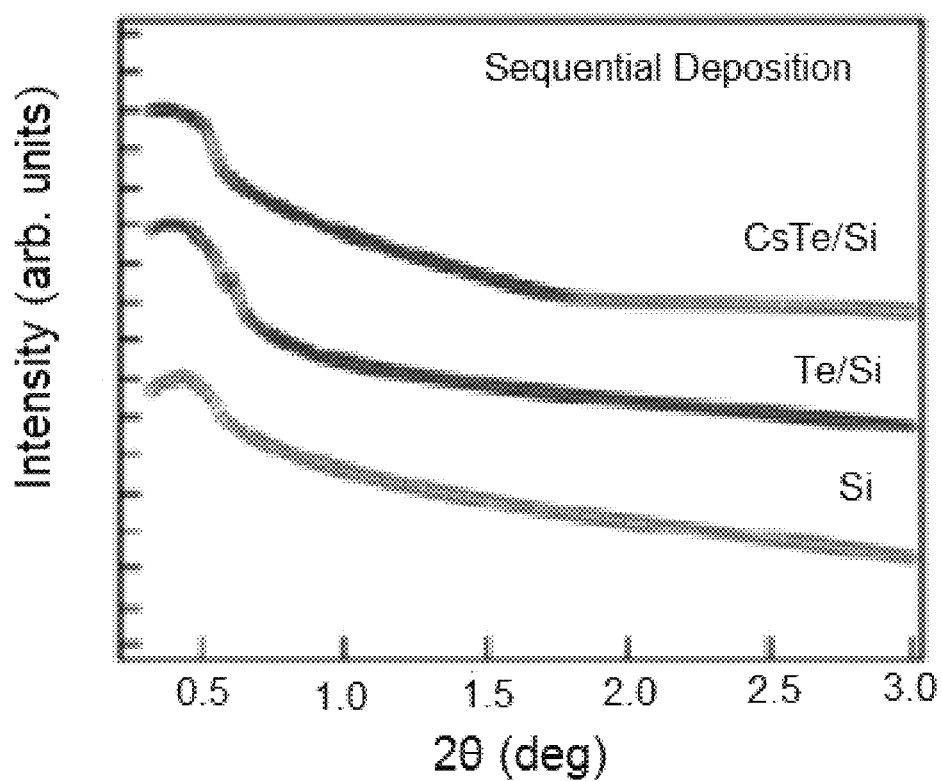
FIGS. 10A-10B depicts graphs illustrating the experimental data and fitting of XRR profiles after each growth where
Figure 10B:
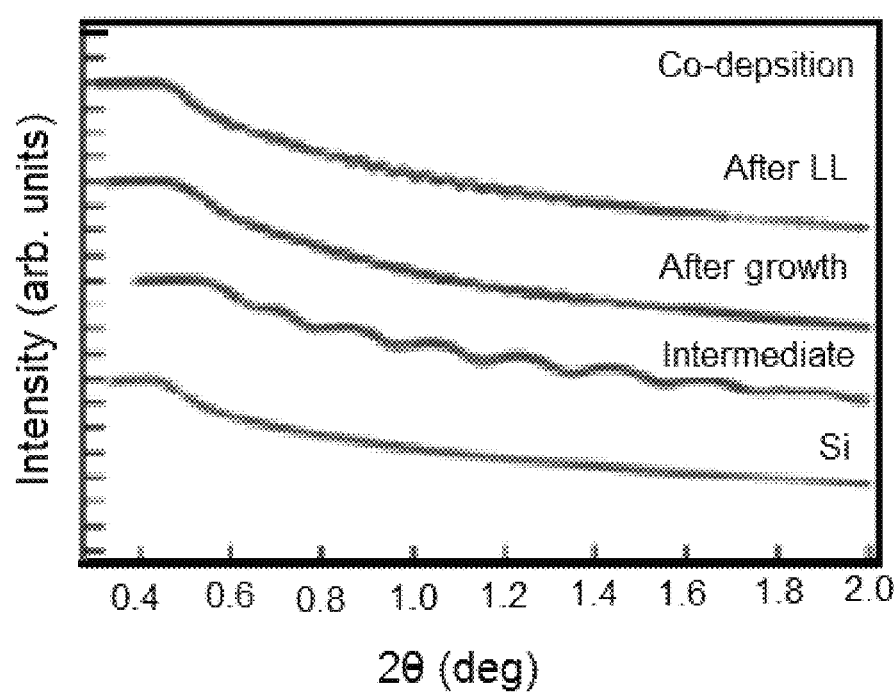

FIGS. 10A-10B depict graphs illustrating data and fitting of XRR profiles after each growth where FIG. 10A depicts sequential CsTe photocathodes and FIG. 10B depicts co-deposited CsTe photocathodes. The plots are offset for clarity. The sequential deposition films are too rough to make reliable fitting. The final cathode thickness of the co-deposited photocathode was fitted to be of ~960 Å (top curve). The oscillations from the Cs/Te/Si sample indicate a relative smooth film surface roughness. In at least one embodiment, X-ray reflectivity measurements were performed after each deposition step for both the sequential and co-dep samples and shown in FIGS. 10A-10B. The XRR data of sequential growth sample suggest or show no obvious oscillations, indicating thin films with rough surfaces. It is hard to construct a reliable fitting of these data to estimate the film thickness and surface roughness. On the other hand, the XRR data of the co-dep sample show oscillations or clear oscillations and fitted with theoretical curves calculated based on layer structure models following Parratt's recursion method to extract film thickness, surface and interface roughness.

FIGS. 10A-10B and Table 3 list the fitting results of the Si substrate, an intermediate layer of ~25 nm, the layer right after growth and the final cathode after the removal of excess Cs. The final thickness of cathode is around 100 nm with a roughness of ~2 nm. After the Cs removal step, the total thickness might have decreased for a few nm with the surface roughness unchanged. The comparison in XRR results indicates a clear improvement in the film roughness for the co-deposited CsTe film, which is also observed for alkali antimonide photocathodes. In an accelerating field where physical roughness dominates the emittance of the electron beam, a smoother cathode may reduce the field emission and improve the intrinsic emittance of the electron beam from the photocathode.

As provided previously, one or more embodiments relates to real time structural analysis and in situ XRF, XRR and spectral response measurements of both sequentially grown and co-deposited CsTe photocathodes. The cathodes from at least one embodiment procedure yield a stoichiometry that is less than Cs:Te=2:1. The comparison between the sequential and co-dep method indicates that the co-deposited cathode incorporates more Cs than the sequential ones. CsTe photocathodes grown by the Cs effusion cell and co-deposition method result in stable and highly textured crystal structure, with ultrasmooth surface of 2 nm surface roughness. The QE of the co-dep cathode reached 19% at 266 nm, while the sequentially grown cathode yields a QE of 8.5% at the same wavelength. Excess Cs might result in a decrease of QE and can be recovered by exposing the cathode to slightly higher content of water and oxygen environment.

Instead of the sequential recipe using getter sources, embodiments of the present method may use effusion cells as the alkali source and growth of the cesium telluride material using a controlled co-deposition method. Embodiments of the method may expose the substrate with an overwhelming vapor pressure of cesium, while slowly turning on the tellurium source. The fluorescence signal from the deposited film is monitored, and the real-time stoichiometry is monitored to maintain a desired ratio of Cs:Te such as a ratio of 2:1 for example. The resulting CsTe film has a closely matched and desired stoichiometry and significantly improved quantum efficiency, crystallinity and surface morphology. The growth parameters may be fine-tuned to improve the lifetime of the present cathode material.

Cesium telluride photocathodes may be grown sequentially in one or more embodiments. Co-deposition methods may use getter sources, which may not provide overwhelming vapor pressure and therefore results in the undesirable stoichiometry and therefore lower quantum efficiency. Embodiments of the present method includes exposing the substrate with an overwhelming vapor pressure of cesium with the use of an effusion cell, while slowly turning on the tellurium source which may control deposition of tellurium. It has been determined that without enough tellurium material, excess Cs will not react. Therefore, an overwhelming vapor pressure of Cs is important to ensure the control stoichiometry with high degree of precision. Alternatively, since the growth is controlled by the deposition of tellurium, precise thickness control of the film is enabled, allowing more freedom in the ability to engineer the thin film, e.g. superlattice growth and heterojunction growth. It is also possible to fine tune the grainsize of the crystal by varying the film thickness. Another benefit of the present method is that this co-deposition procedure may give a smoother surface of the photocathode, allowing for the possibility of a low emittance application and thin film engineering. The fluorescence signal from the deposited film is watched, and the realtime stoichiometry is monitored to make sure the Cs:Te ratio is 2:1. The photocathode prepared by embodiments of the present method may have twice as much quantum efficiency as the ones that are sequentially grown. It may be highly crystallized, and the surface may be well defined.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above. As utilized herein, the terms "about," "substantially," and other similar terms are intended to have a broad meaning in conjunction with the common and accepted usage by those having ordinary skill in the art to which the subject matter of this disclosure pertains. As utilized herein, the term "approximately equal to" shall carry the meaning of being within 15, 10, 5, 4, 3, 2, or 1 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

What is claimed is:

1. A method of growing photocathodes, comprising:
   exposing a substrate of Si wafer to an alkali source comprising K and Li;
   controlling co-evaporating growth and co-deposition; forming a growth including Te;
   monitoring a stoichiometry of the growth, and forming the photocathodes having a 2 nm surface roughness and high quantum efficiency of 19% at 266 nm.

2. The method of claim 1 further comprising an effusion source, wherein the effusion source is one or more effusion cells.

3. The method of claim 1 wherein the substrate is exposed to a vapor pressure of an alkali metal group using the alkali source.

4. The method of claim 3 wherein the substrate is additionally exposed to a vapor pressure of Cs using the alkali source.

5. The method of claim 1 further comprising using a Te source to control the co-evaporating growth and co-deposition.

6. The method of claim 5 further comprising turning on the Te source to control the co-evaporating growth and co-deposition.

7. The method of claim 5 using in situ real time x-ray fluorescence to monitor the stoichiometry of the growth including Te growth.

8. The method of claim 7 wherein the stoichiometry of the growth including Te growth is about 2:1.

* * * * *